United States Patent [19]

Woodall

[11] Patent Number: 4,525,814

[45] Date of Patent: Jun. 25, 1985

[54] LEAKAGE TESTING CABLE CONNECTOR NETWORK

[75] Inventor: James C. Woodall, Houston, Tex.

[73] Assignee: Mark Products Incorporated, Houston, Tex.

[21] Appl. No.: 410,541

[22] Filed: Aug. 23, 1982

[51] Int. Cl.³ .................. G01V 1/38; G01R 27/26; G01R 31/08

[52] U.S. Cl. ........................ 367/20; 324/52; 324/61 R; 73/1 DV; 73/40; 179/175.3 F

[58] Field of Search .......... 367/20, 77; 73/1 DV, 73/40; 166/337; 179/175.3 R, 175.3 F, 175.3 A; 178/69 C, 69 E, 69 R; 324/52, 61 R

[56] References Cited

U.S. PATENT DOCUMENTS

| | | | |
|---|---|---|---|
| 3,584,953 | 8/1970 | Grant | 324/61 R |
| 3,622,875 | 11/1971 | Hamamatsu-shi | 324/61 R |
| 3,710,244 | 1/1973 | Rauchwerger | 324/61 R |
| 3,765,240 | 10/1973 | Haus, Jr. | 73/40 |
| 3,771,548 | 11/1973 | Rauchwerger | 324/61 R X |
| 4,366,561 | 12/1982 | Klein | 362/77 |
| 4,400,663 | 8/1983 | May | 324/52 |
| 4,410,850 | 10/1983 | Pesto et al. | 179/175.3 F X |

Primary Examiner—Nelson Moskowitz
Assistant Examiner—Brian Scott Steinberger
Attorney, Agent, or Firm—Vaden, Eickenroht, Thompson & Jamison

[57] ABSTRACT

Disclosed is test apparatus included in a cable transmission system having intermediate local data units spaced along a cable, one connection to the cable also being to a master or control station. At each data unit, there is an input differential amplifier with two input terminals for application of at least one local data signal. A test signal is applied to the data unit via a transmission connection from the master station to a first element of a voltage divider connected to one of the two input terminals of the differential amplifier. A switch at the data unit is connected for disconnecting the data connection from the other input terminal of the differential amplifier. A second switch at the data unit, provides a connection to a conductor leading to the master station for connecting earth ground to the data unit local circuit common. Measuring the output voltage level from the data unit, which may be conveniently done via the communication link to the master station, reveals the presence of a leakage impedance path at the local unit.

7 Claims, 3 Drawing Figures

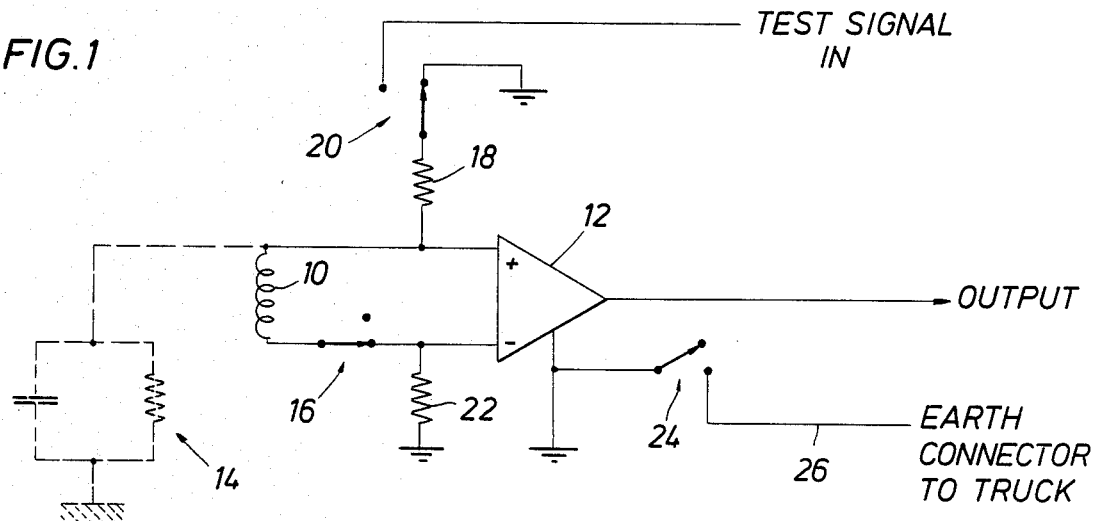
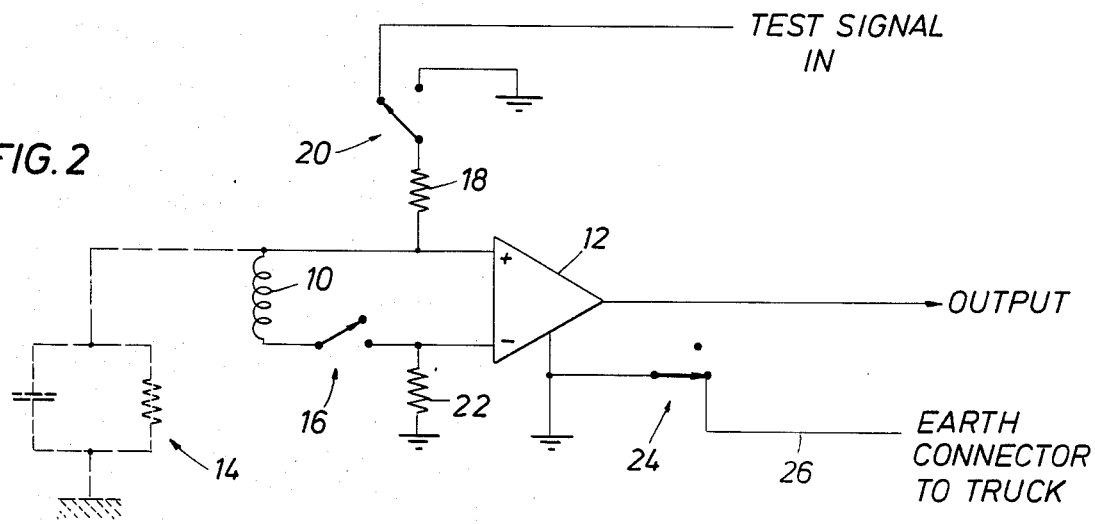
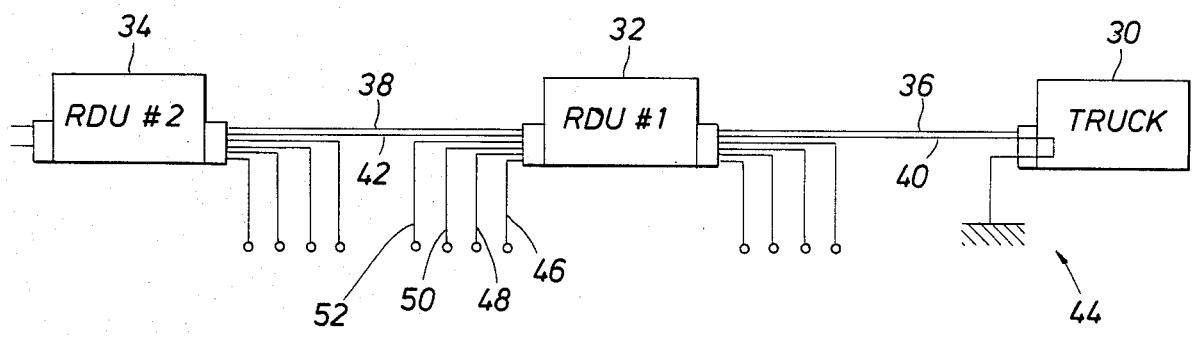

LEAKAGE TESTING CABLE CONNECTOR NETWORK

BACKGROUND OF THE INVENTION

1. Field of the Invention

This invention pertains to a cable transmission system, such as commonly employed in communicating seismic data from a plurality of localized data gathering stations or units to a control or master station, and more particularly to testing the local data units for the presence of possible environmental water leakage.

2. Description of the Prior Art

A seismic data gathering system commonly comprises a plurality of local data stations or units spaced apart along a line, or in a predetermined grid pattern. The locations are determined to give satisfactory terrain coverage so that the data collection from seismic reflections will be more or less uniform and so that there will not be any appreciable data skips.

Sometimes this results in the local stations, commonly referred to as remote data units (RDU's), being located in low lying areas subject to occasional flooding and even in swampy conditions where water stands virtually all of the time.

Each data unit receives local data via one or more data measuring devices, commonly one or more geophones. More commonly, an array of geophones provides in time multiplex fashion a plurality of local data measurements. In more sophisticated systems, each data measuring input to the local data unit is a composite from a plurality of individual geophone connections.

A geophone connection is normally made via a coil in the geophone which is connected into an input stage of the electronics at the data unit. The electronics at the data unit comprises a plurality of networks but generally includes preamplifiers, filters and amplifiers as well as the communication components necessary to provide communication with the master or control station. In addition, the local electronics at an RDU permits data multiplexing with other data information originating at other RDU's. Also, control components are included in the RDU to permit reception of control signals for providing operation in accordance with the system and for providing testing.

The electronics of each RDU is generally housed in a common case, which is normally painted or anodized metal or plastic. Although the electronics within the case are connected to a circuit common or ground within the case, such common is isolated from earth ground unless an earth ground connection is also provided. Because of the temporary nature of setting the RDU's in place and the difficult locations that are sometimes involved, it is not readily possible to provide a local ground connection. In fact, because of difficult terrains encountered in many installations and because of the inconvenience to the crew of having to make a local ground connection at the RDU's, a local earth ground connection is not normally provided and, hence, the circuit common at each RDU "floats" without being connected to earth ground.

The individual data measurement units, commonly geophones, are desirable watertight. Further, the RDU's are desirable watertight. However, it is well known that leakage does occur and when it occurs there is generally established a conductive path to ground that causes depreciation of the developed signals. This depreciation or decrease in the signal strength is sometimes not readily ascertainable since the impedance path to ground or earth which causes the signal depreciation is sometimes a sufficiently high impedance path that the data signals are not totally lost but only lowered in amplitude. Obviously, a loss in amplitude of a seismic measurement has adverse interpretation consequences for analyzing the data measurements. Furthermore, when an extraneous path is provided into the system, the possibility also exists for a hum or spurious signal to be superimposed upon the data. In many areas, a 60 Hz signal is superimposed upon the data, resulting in a further decrease or depreciation of the measured data signals.

When water does leak into a geophone or the compartment housing the RDU, there is established this aforementioned impedance path to earth, which may be characterized as an equivalent circuit that is somewhat resistive and somewhat capacitive. Also, the path may be quite severe or might be slight, in which case it would be characterized as a very high impedance path. In either event, it is a problem to the development of reliable data from the installation.

In prior art cable transmission systems, it has been incumbent upon the crews laying the cable to carefully inspect for leakage. This condition cannot be reliably remotely controlled or monitored in an acceptable manner. Before the present invention, the possible existence of leakage was a condition that just had to be tolerated. If the condition was so bad that the data was obviously adversely affected, then the suspect components were replaced and the data redeveloped, all at great expense and loss of time.

Therefore, it is a feature of the present invention to provide improved leakage testing apparatus for remotely determining the presence thereof of water leakage at the RDU and/or at the individual data measuring devices which are attached to the RDU, namely, geophones.

It is another feature of the present invention to provide an improved testing of a cable transmission system with intermediate data units therealong and having a master control station where testing control signals and ground connection therefor are all by way of connection through the master control station.

It is still another feature of the present invention to provide an improved cable data transmission system in which it is unnecessary to establish an earth ground at the individual remote data units since it is determined before operation that there is virtually no leakage, data-impairment connection to ground.

SUMMARY OF THE INVENTION

The invention embodiment disclosed herein is a cable transmission system including therealong a plurality of local data units. Each of these units includes an input from at least one data measuring device, such as a geophone coil. Each unit includes an electronic circuit therein, the data measured input being to a differential amplifier stage. The data input is normally applied by a geophone coil connected across the two input terminals of the differential amplifier. One terminal of the differential amplifier is also connected to a voltage divider resistive element leading through a first switch to a test signal input from the master station. A second switch disconnects the local data input to the other differential amplifier input terminal. Finally, electrical common is connected through a switch at the RDU to a conductor leading to the master control station. The conductor is grounded to earth at the master control station.

By monitoring the voltage condition of the output of the remote data unit at the time of applying a test signal, the leakage impedance to ground is detected and measured as the other voltage that exists between the leakage impedance and the element through which the test signal is applied. This is a voltage divider type of measurement. The detected and measured leakage impedance can also be quantified at the master control station.

BRIEF DESCRIPTION OF THE DRAWINGS

So that the manner in which the above-recited features, advantages, and objects of the invention, as well as others that will become apparent, are attained and can be understood in detail, more particular description of the invention briefly summarized above may be had by reference to the embodiment thereof which is illustrated in the appended drawings, which drawings form a part of this specification. However, the appended drawings illustrate only a typical embodiment of the invention and are therefore not to be considered limiting of its scope for the invention may admit to other equally effective embodiments.

IN THE DRAWINGS

FIG. 1 is a partial simplified schematic diagram of the test portion of the apparatus of the present invention at a local remote data unit in accordance with a preferred embodiment, the switches therein being in the non-test condition.

FIG. 2 is a partial simplified schematic diagram of the test apparatus shown in FIG. 1 wherein the switches are shown in the test condition.

FIG. 3 is a partial block diagram of the test apparatus of a data transmission system in accordance with a preferred embodiment of the present invention.

DESCRIPTION OF THE PREFERRED EMBODIMENTS

Remote data units (RDU's) of a seismic data transmission system are connected sequentially in conventional manner in a cable system to a control or master station located at one end. The master station initiates control signals for activating each of the RDU's in a time multiplex operation so that the data transmissions are timed in a non-interferring manner for transmission back to the control station for recording and analysis purposes. Suitable transmission links include not only the conventional cable sections for such purpose but also radio communications channels and fiberoptic channels. Data transmission systems differ as to detail operation of the master control station and in the individual RDU's; however, almost all currently used master and remote units operate in the general manner and to the extent which has just been described.

At each RDU there is located at least one geophone or other suitable data measuring device. It is more usual, however, for there to be an array of geophones connected for generating a plurality of local data signals on different channels of communication. Electrical impulses that are generated by the geophone or by the geophone array are relatively weak signals that must be locally amplified prior to transmission. Normally located in the RDU is an electronic circuit including a preamplifier and an amplifier for voltage amplification purposes. The first stage of the preamplifier is generally a differential amplifier. The signal from the geophone or geophone array is normally applied to a differential amplifier 12 by way of a geophone coil 10 connected across the input terminals of the differential amplifier. Alternatively to the simplified version illustrated, physical connections can be directly made to additional geophone coils via appropriate connection and switching apparatus.

The output of the differential amplifier is connected to the remaining stages of the preamplifier within the RDU. From there, the output of the preamplifier is connected to the amplifier and then to the logic circuits within the remote data unit. The output from the unit is connected to the communication transmission network and controlled for transmission purposes by appropriate address signals from the master control station.

If there is water in the remote data unit or in any of the geophones or connections, including cable connections, that are employed to interconnect the remote data unit with the data measuring devices (e.g., geophones), then there is an impedance path to ground that is manifested by an impedance 14 connected across coil 10. The presence of this unwanted impedance, which may be a purely resistive impedance or somewhat capacitive in nature and therefore is drawn as a parallel combination as a resistor and a capacitor, can be detected by providing certain additional apparatus connections which are made within the remote data unit. These connections are made via switches which are remotely controlled from the master control station. Returning to FIG. 1, a resistor 18, nominally a 10K ohm resistor, is connected to the positive terminal of differential amplifier 12 for connecting a test signal input from the master control station. Switch 20 is included to disconnect resistor 18 from its operational electrical common to receive the incoming test signal.

Another switch 16 is connected in series between coil 10 and the negative terminal of differential amplifier 12. A second resistor 22 of the same approximate value as resistor 18 is connected to the negative terminal of differential amplifier 12 and resistor 22 is connected during operation (i.e., at non-test times) to electrical circuit common, which is illustrated in the drawings as being three successively shorter horizontal lines.

Electrical common within the RDU is connected through switch 24 to a conductor 26 that leads to the master control station. In non-test operating conditions, switch 24 is left opened and therefore the local circuit common "floats" without being tied to earth ground.

Although the RDU is shown with three connections to the master control station, it may be understood that intermediate RDU's may be present. However, all three connections are made through such intermediate RDU's back to the control station so that even the conductor 26 which has been described can be thought of as all time being connected to earth ground at the master station.

The leakage which is being tested for provides the impedance 14 which is illustrated in FIGS. 1 and 2 and which is further illustrated as a parallel combination of a resistor and a capacitor to earth ground. Please note that earth ground is shown in a different form than the circuit common ground previously described.

Now turning to FIG. 2, switches 16, 20 and 24 are all shown in their test signal positions. That is, switch 20 connects the test signal to resistor 18, switch 16 opens the connection between geophone coil 10 and the negative terminal of differential amplifier 12 and switch 24 connects circuit common for the RDU electrical circuit to a conductor which is connected to earth ground at the control station.

The test signal for the purposes of testing for leakage is a controllable voltage at a known dc level. If there is no impedance path to earth which exists at impedance path 14, then with the opening of switch 16, there is a predetermined input at the differential amplifier. It should be noted that the differential amplifier is connected to the remaining stages of a preamplifier within the data unit and the output of the preamplifier is connected to the remaining circuitry therein, including filters, amplifiers and the like, resulting eventually in an output from the data unit. Under these controllable test conditions the output is a predetermined strength or amplitude signal which is communicated via the communications network to the master or control station where it is observed or metered.

However, if an impedance path 14 does exist, there is a voltage dividing action between this impedance path and resistor 18 which reduces the input level to differential amplifier 12 and results in a reduced output. This reduced output shows the operator at the control station that there is leakage and therefore any resulting data measurement in transmission would be decreased or depreciated due to such leakage.

It should be noted that the measure can be quantified so that the actual amount of leakage impedance is available to the operator at the control station.

A typical arrangement for a transmission and communication system is shown in FIG. 3 for a master or control station 30 connected to RDU#1 32 and RDU#2 34 in the chain of remote data units. Additional RDU's are successively connected to the left of what has been diagrammed. A communication link exists between truck 30 and RDU#1 32 in the form of a conventional cable 36, fiberoptic conduit, radio link or the like. In similar fashion, a communication link 38 exists between RDU#1 32 and RDU#2 34.

Also linking the RDU#1 and RDU#2 to master control station truck 30 are physical electrical conductors 40 and 42. It should be particularly noted that an electrical conductor provides a hard ground to earth through the connector at truck 30, which is shown by reference numeral 44.

At each RDU a plurality of geophones or geophone arrays 46, 48, 50 and 52 are connected to each RDU through one of the RDU connectors. A common system includes eight data measuring devices such as geophones or geophone arrays and therefore there are four connections made through each of the two connectors illustrated for RDU#1 as shown in FIG. 3.

In the discussion above with regard FIGS. 1 and 2, it has been assumed that a single geophone coil 10 was being tested for leakage via an unwanted impedance path 14. However, additional switches may be provided for the other locally generated data measurements which are measured by the other geophones or geophone arrays. Through these other switches, it is possible to sequentially select each successive device for similar leakage testing.

Furthermore, the very nature of the RDU that provides multiple channel communications to truck 30 provides time multiplexing of not only the various channels representing each of the individually selectable data measurement channels at each RDU, but also selective time multiplexing of the RDU's themselves in the data transmission system. Discrimination of a particular device at a particular RDU is readily available at the truck in the same manner as it would identify what RDU and what data measuring device is being monitored for data purposes during data collection and transmission. That is, no additional discrimination network is required for testing purposes.

It should be noted that the switches which are discussed above are normally semi-conductor switches, but exact circuits or network components can vary. It should also be noted that other tests can be provided via the test signal input line through the same and additional switches as disclosed herein, such as a sine wave signal for testing for distortion and the like.

It should be further noted that the apparatus which is provided herein provides a ground connection for each of the RDU's for test and operational purposes, if desired, without having to physically stake or otherwise provide a positive ground connection at each of the RDU's and provides such indication of the presence and quantity of leakage at each of the separately measured input devices such that one operator located at the master control station has complete control over the system without relying on whether or not some member of a seismic installation crew did his job properly at a particular remote data station.

Any determined leakage difficulty can be pinpointed and rectified prior to accepting the validity of data which would otherwise be transmitted in connection therewith.

Further, although only one input differential amplifier is illustrated in FIGS. 1 and 2, in an actual typical RDU, there may be many separate input channels in a plurality of different differential amplifiers. The operation of such RDU electronic variation is readily adaptable to the testing apparatus which has been described above.

Although a preferred embodiment of the invention, therefore, is shown in the drawings, alternate embodiments may be employed within the spirit and scope of the invention described and illustrated. For example, the embodiment described is in connection with a seismic cable data transmission system. Obviously, a transmission system for other than seismic data can include the same testing apparatus that has been described herein.

What is claimed is:

1. Apparatus for determining the presence of leakage at each of a plurality of data units in a data transmission system having sequentially connected data units cable-connected to a control station, comprising at each of said data units an electronic data transmission network including a differential amplifier connected to receive a local data signal across its input terminals whose full amplitude value is at least partially decreased in the presence of a leakage connection to earth, said network being connected to electrical circuit common, an input voltage divider element connected to a first of the input terminals of said differential amplifier for receiving a test voltage, a complementary voltage divider element connected to the second input terminal of said differential amplifier and connected to the electrical circuit common for the data unit, a connecting earth conductor from the electrical circuit common to said control station for connecting to the electrical circuit common at said control station, the control station electrical circuit common being connected to earth, and switch means at said data unit for opening the connection between the local data signal and said second input terminal of said differential amplifier and for connecting the electrical circuit common at said data unit to said connecting earth conductor, the output level from said differential amplifier indicating the presence of a leakage connection to earth.

2. Apparatus in accordance with claim 1, and including a switch for disconnecting said test voltage from said input voltage divider element and connecting said element to said electrical circuit common.

3. Apparatus in accordance with claim 1, and including a geophone coil for application of said local data signal.

4. Apparatus in accordance with claim 3, and including additional geophone coils for application of additional local data signals, and additional switch means for serially selecting each of said additional data signals for the testing of the presence of a leakage connection therewith.

5. Apparatus in accordance with claim 4, wherein said control station and said electronic data transmission network at each of said data units includes time multiplexing network components for discriminating among the local data signals being tested for the presence of a leakage connection.

6. Apparatus in accordance with claim 5 and including data transmission means between said data units and said control station for providing an indicating readout at said control station.

7. Apparatus in accordance with claim 4, wherein said control station and said data units includes addressing network components for selecting the leakage connection testing a particular data unit from said sequentially connected data units.

* * * * *